United States Patent [19]

Hill

[11] Patent Number: 4,473,862

[45] Date of Patent: Sep. 25, 1984

[54] CIRCUIT FOR CONTROLLING AN ELECTROMAGNET

[75] Inventor: William F. Hill, Stafford, England

[73] Assignee: Lucas Industries Limited, Birmingham, England

[21] Appl. No.: 299,501

[22] Filed: Sep. 4, 1981

[30] Foreign Application Priority Data

Sep. 6, 1980 [GB] United Kingdom ............... 8028860

[51] Int. Cl.³ .................... H01H 47/04; H01H 47/32
[52] U.S. Cl. ..................................... 361/155; 361/154
[58] Field of Search ................ 361/154, 155, 152, 156

[56] References Cited

U.S. PATENT DOCUMENTS

| | | | |
|---|---|---|---|
| 3,064,165 | 11/1962 | Kennedy | 361/155 |
| 3,549,955 | 12/1970 | Paine et al. | 361/155 |
| 4,112,477 | 9/1978 | Sherwin | 361/155 |
| 4,148,090 | 4/1979 | Kawai et al. | 361/152 |
| 4,173,030 | 10/1979 | Rabe | 361/154 |
| 4,318,155 | 3/1982 | Thomas | 361/156 |

*Primary Examiner*—Reinhard J. Eisenzopf

[57] ABSTRACT

A control circuit for an electromagnet includes a main current control element in series with the electromagnet winding and controlled so as to switch on and pass a "pull-in" current for an initial period and to control the current to a lower "hold" level during a subsequent period. A capacitor is connected in series with a diode and a transistor across the winding and the transistor is controlled to switch on during the change from "pull-in" to "hold" so that the capacitor is charged up during this change. A second transistor is connected in series with a second diode to permit reverse current flow from the capacitor to the winding during switch-off to hasten collapse of the flux in the winding and overcome the drop-out delaying effect of eddy currents in the electromagnet core.

8 Claims, 2 Drawing Figures

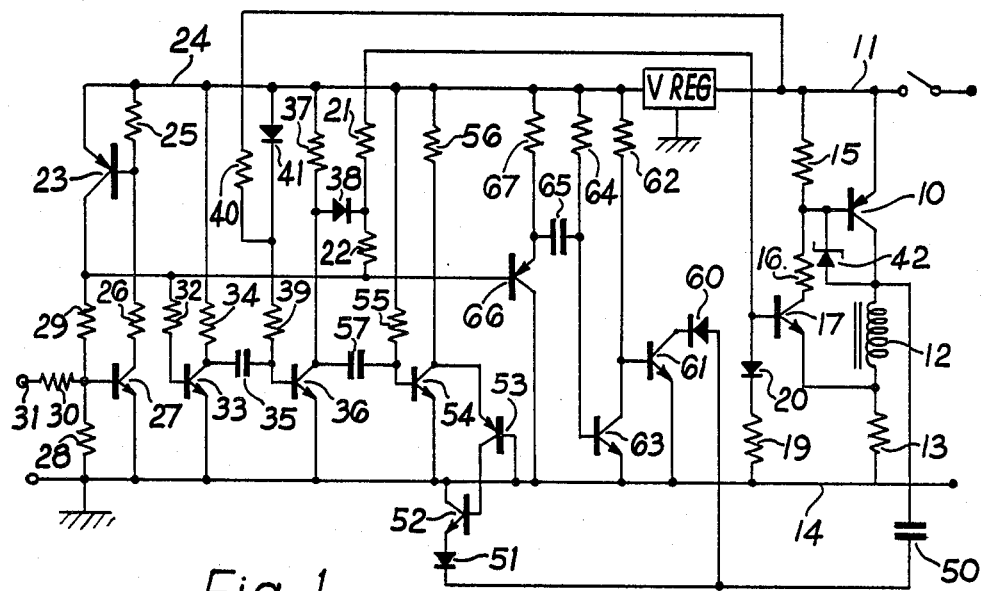
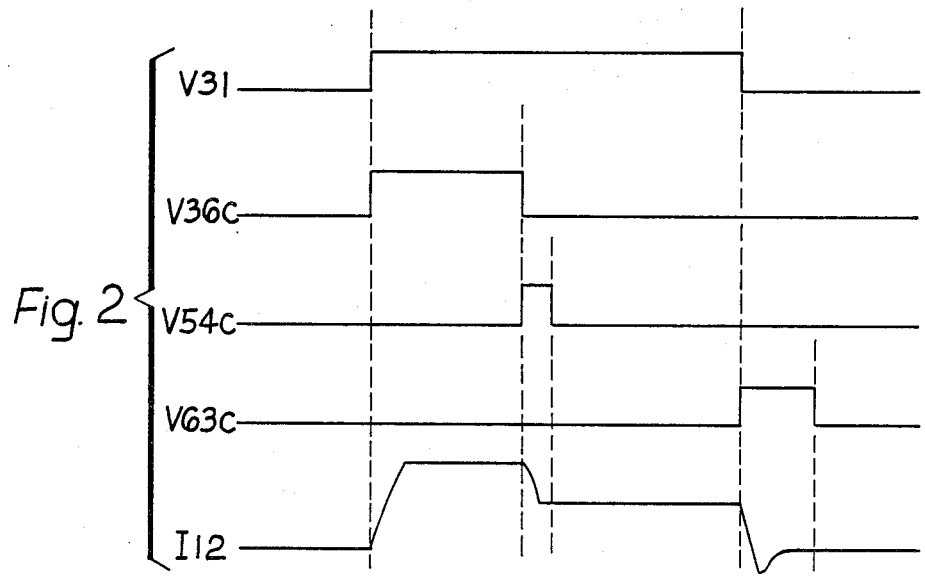

CIRCUIT FOR CONTROLLING AN ELECTROMAGNET

This invention relates to a circuit for controlling an electromagnet and is particularly, but not exclusively, concerned with the control of the electromagnet of an i.c. engine fuel injection valve.

In an application such as i.c. engine fuel injection fuel metering is generally accomplished by controlling the time for which the injection valve is open. Delays in opening the valve at the commencement of injection and closing the valve at the end of injection, contribute to inaccuracy of metering, particularly when the valve electromagnet is of cheap construction utilizing a non-laminated core so that eddy currents can play a part in determining the durations of the delays mentioned above.

The present invention is specifically concerned with shortening the delay with occurs at switch-off and whilst various arrangements have previously been proposed for this purpose all have involved expensive additional components such as inductors or have otherwise been unsatisfactory.

A circuit in accordance with the invention includes a main current control element in series with the electromagnet winding across a supply, said current control element acting initially as a switch to allow "pull-in" current to pass through the winding, and subsequently as a current limiter to limit the current to a lower "hold" level, and a capacitor having associated diodes and/or switching components for connecting it across the winding once during change over from "pull-in" to "hold" to acquire a reverse charge thereon and again at switch off so that the capacitor can discharge in the winding to provide a magnetizing force in opposition to that of the eddy currents sustained in the core after the main current control is switched off.

An example of the invention is shown in the accompanying drawing in which,

FIG. 1 is a circuit diagram of an electromagnet control circuit and,

FIG. 2 is a graph showing the operation of the circuit.

In the circuit shown there is a main current control element 10 in the form of a pnp transistor which has its emitter connected to a positive supply rail 11 and its collector connected via the electromagnet winding 12 and a current sensing resistor 13 in series to an earth rail 14. The base of the transistor 10 is connected to the junction of two resistors 15 and 16 which are in series between the rail 11 and the collector of an npn transistor 17. The emitter of transistor 17 is connected to the junction of the winding 12 and the current sensing resistor 13. The base of transistor 17 is connected to the anode of a diode 17 which has its cathode connected by a resistor 19 to the rail 14.

The base of transistor 17 is also connected by two resistors 21 and 22 in series to the collector of a pnp transistor 23. This transistor 23 has its emitter connected to a regulated voltage supply rail 24 and its base connected by a resistor 25 to the rail 24 and by a resistor 26 to the collector of an npn transistor 27. The emitter of transistor 27 is grounded to rail 14 and its base is connected by a resistor 28 to the rail 14, by a resistor 29 to the collector of the transistor 23 and by a resistor 30 to an input terminal 31. Transistors 23 and 27 act as a regenerative switch controlled by the input signal at the terminal 31, the signal at the collector of transistor 23 being high whenever the input signal is high.

The collector of the transistor 23 is connected by a resistor 32 to the base of an npn transistor 33. This transistor 33 has its emitter grounded to rail 14 and its collector connected by a resistor 34 to the rail 24. The collector of the transistor 33 is connected by a capacitor 35 to the base of an npn transistor 36 which has its emitter grounded to the rail 14 and its collector connected by a resistor 37 to the rail 24. The collector of the transistor 36 is connected to the anode of a diode 38, the cathode of which is connected to the junction of the resistors 21 and 22. The base of the transistor 36 is connected by two resistors 39, 40 in series to the rail 11, a diode 41 having its anode connected to the rail 24 and its cathode connected to the junction of the resistor 39, 40.

The circuit thus far described acts to control the current level in the winding 12. When the input signal goes high, transistors 23 and 27 both turn on and also turn on the transistor 33. The capacitor 35 thus starts to discharge diverting base current from the transistor 36, thereby causing the latter to turn off. Whilst transistor 36 is off, a relatively high current flows through resistor 37, diode 38, resistor 21 diode 20 and resistor 19, thereby establishing a relatively high voltage at the base of the transistor 17. Transistor 10 turns hard on and the current in the winding 12 rises until a "pull-in" current level is reached, when the voltage across resistor 13 becomes high enough to turn transistor 17 partially off.

When the voltage on capacitor 35 has reversed transistor 36 turns on so that no current flows through diode 38. Instead a relatively low current flows through transistor 23 resistor 22, 21 and 19 in series and the diode 20. This causes the transistor 17 to turn off and a zener diode 42 connected across the base-collector of the transistor 10 provides, when necessary, sufficient current in the transistor 10 to limit the negative going excursion of the collector of transistor 10 caused by the release of excess energy in the core of the winding 12. When the current has fallen to a "hold" level transistor 17 turns partially on again and regulates the current at this level until the input signal goes low again.

The circuit also includes, however, a capacitor 50 which is arranged as explained hereinafter, to collect part of the energy released from the electromagnet at the time of change-over from "pull-in" current to "hold" current, this energy being released when the electromagnet is switched off to ensure rapid flux collapse and hence rapid drop-out.

Charging of capacitor 50 takes place via a diode 51 and an npn transistor 52. One side of the capacitor 50 is connected to the collector of transistor 10. The other side of capacitor 50 is connected to the cathode of diode 51. The anode of diode 51 is connected to the emitter of transistor 52, the collector of which is connected to the ground rail 14.

The base of the transistor 52 is connected to the collector of a pnp transistor 53 which has its base connected to rail 14 and its emitter connected to the collector of an npn transistor 54. Transistor 54 has its emitter connected to rail 14 and its base and collector connected to the rail 24 by respective resistors 55, 56. Additionally, a capacitor 57 connects the base of the transistor 54 to the collector of the transistor 36.

Transistor 54 is normally conducting, as a result of bias current through resistor 55, and thus maintains transistor 53, and hence transistor 52, non-conductive.

Whilst transistor 36 is off, however, capacitor 57 charges up, via resistor 21, so that when transistor 36 turns on again capacitor 57 holds the base of transistor 54 reverse biased for a time, until the current through resistor 55 has discharged capacitor 57. This time interval thus commences when reduction of the current in the winding 12 is commenced and the values of capacitor 57 and resistor 55 are chosen so that transistor 54 remains off until the current in winding 12 has reached "hold" level.

It will be appreciated that transistor 52 is thus conductive during this current reduction period so that capacitor 50 can accept energy from the electromagnet and become charged with the side connected to the collector of transistor 10 becoming negative relative to its other side. Transistor 10 is non-conductive during the charging of the capacitor 50.

This "other" side of capacitor 50 is also connected to the anode of a diode 60, the cathode of which is connected to collector of an npn transistor 61. This transistor 61 has its emitter connected to rail 14 and its base connected to the rail 24 by a resistor 62 and also connected to the collector of an npn transistor 63. The emitter of the transistor 63 is connected to the rail 14 and its base is connected by a resistor 64 to the rail 24 and by a capacitor 65 to the emitter of a pnp transistor 66; which emitter is also connected by a resistor 67 to the rail 24. The collector of transistor 66 is connected to the rail 14 and its base is connected to the collector of the transistor 23.

The transistor 66 is on whenever the input signal to the circuit is low. When transistor 66 turns on, transistor 63 turns off for a time dependent on the values of resistor 64 and capacitor 65. Whilst transistor 63 is off transistor 61, which is normally off, becomes conductive. This occurs at the time of the reduction of current in the winding 12 from "hold" level to zero and the time for which transistor 61 is on is selected so as to be longer than the time taken for this current reduction. It will be appreciated that the charge stored in the capacitor 50 will create a reverse current in the winding 12 opposing the current previously flowing therein and causing a very rapid decay and drop-out of the electromagnet. Such reverse current occurs when the reverse voltage on winding 12 falls below the voltage stored on capacitor 50.

In a modified form of the invention the transistor 52 and the components 53 to 57 which control it may be omitted and the anode of the diode 51 is then connected directly to the rail 14. In this case, at switch off, when the reverse voltage across the winding 12 is higher than that stored in the capacitor 50, further transfer of energy into the capacitor 50 may occur until the winding voltage falls below the capacitor voltage and the capacitor can start to discharge into winding, accelerating flux decay and overcoming the effects of eddy currents in the core as before.

The value of the capacitor 50 is selected to suit the operating conditions of the circuit. In some circuits it is preferable to use a relatively small value capacitor which discharges completely into the winding at switch off.

Alternatively a relatively large capacitor may be employed, so that only a part of the charge stored therein is released at each switch-off. Several cycles of operation will be required initially for the capacitor to acquire a working level of charge.

In yet another modification, the transistor 61 may be replaced by a thyristor (or a triac), the control circuitry being altered appropriately. In this case, the capacitor 50 must be fully discharged at each turn and consequently must be of relatively small value to ensure that it is charged to a sufficient voltage in each cycle.

In the circuit described above, resistor 40 acts to prolong the pull-in period if the battery voltage falls, such as during cold-starting of an engine of which the electromagnet forms a part of the fuel injection system.

I claim:

1. A circuit for controlling an electromagnet having a winding with first and second terminals, said circuit comprising:

a main current control element in series with the electromagnet winding across a supply, said main current control element acting initially as a switch to allow "pull-in" current to pass through the winding from said first terminal to said second terminal, and subsequently as a current limiter to limit the current to a lower "hold" level;

a capacitor; and current path means for connecting said capacitor across the winding, for conducting during changeover from "pull-in" to "hold", permitting current flow through said capacitor from said second terminal to said first terminal and providing a reverse charge on said capacitor, and for conducting again at switch-off, discharging said capacitor through the winding, reversing the winding current and providing a magnetizing force in opposition to that of eddy currents sustained in the electromagnet after said main current control element is switched off.

2. A circuit as claimed in claim 1, wherein said main current control element comprises a main transistor, and said circuit further comprising a control transistor operatively connected to and controlling said main transistor and sensitive to the current in said winding.

3. A circuit as claimed in claim 1 or 2, wherein said current path means comprises first and second parallel current paths, one conductive during changeover and the other conductive at switch-off.

4. A circuit as claimed in claim 2, wherein said control transistor has an emitter and a base, and said circuit further comprising:

a current sensing resistor in series with the winding and connected to the emitter of the control transistor; and means connected to the base of the control transistor for applying a first voltage signal to the base of the control transistor during "pull-in" and a lower second voltage signal thereto during "hold".

5. A circuit for controlling an electromagnet having a winding with first and second terminals, said circuit comprising:

a main current control element in series with the electromagnet winding across a supply, said main current control element acting initially as a switch to allow "pull-in" current to pass through the winding from said first terminal to said second terminal, and subsequently as a current limiter to limit the current to a lower "hold" level, said main current control element comprising a main transistor;

a capacitor;

current path means for connecting said capacitor across the winding, for conducting during changeover from "pull-in" to "hold", permitting current flow through said capacitor from said second terminal to said first terminal and providing a reverse charge on said capacitor, and for conducting again at switch-off, discharging said capacitor through the winding, reversing the winding current and providing a magnetizing force in opposition to that of eddy currents sustained in the electromagnet after said main current control element is switched off;

a control transistor, having an emitter and a base and having a collector operatively connected to said main transistor, for controlling said main transistor and being sensitive to the current in said winding;

a current sensing resistor in series with the winding and connected to the emitter of the control transistor; and means, connected to the base of the control transistor, for applying a first voltage signal to the base of the control transistor during "pull-in" and a lower second voltage signal thereto during "hold".

6. A circuit as claimed in claim 5, wherein said current path means comprises first and second parallel current paths one conductive during changeover and the other conductive at switch-off.

7. A circuit as claimed in claim 6, wherein said current path means further comprises:

a first diode connected in series with said capacitor and arranged to permit current flow in one direction during the change from "pull-in" to "hold"; and a first transistor and a second diode connected in series with said capacitor and permitting current flow in the opposite direction at switch-off.

8. A circuit as claimed in claim 7, further comprising a second transistor in series with said first diode and being conductive during said change.

* * * * *